(12) United States Patent
Sugiyama

(10) Patent No.: US 11,700,708 B2
(45) Date of Patent: Jul. 11, 2023

(54) FAN UNIT HOLDING MECHANISM AND AUTOMATIC DOCUMENT FEEDER INCLUDING FAN UNIT HOLDING MECHANISM

(71) Applicant: TOSHIBA TEC KABUSHIKI KAISHA, Tokyo (JP)

(72) Inventor: Ryota Sugiyama, Fuji Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 204 days.

(21) Appl. No.: 17/343,117

(22) Filed: Jun. 9, 2021

(65) Prior Publication Data
US 2022/0087057 A1    Mar. 17, 2022

(30) Foreign Application Priority Data
Sep. 14, 2020    (JP) ................................ 2020-153500

(51) Int. Cl.
| H05K 7/20 | (2006.01) |
| F04D 19/00 | (2006.01) |
| B65H 27/00 | (2006.01) |
| G03G 21/20 | (2006.01) |
| F04D 29/60 | (2006.01) |

(52) U.S. Cl.
CPC ......... *H05K 7/20172* (2013.01); *B65H 27/00* (2013.01); *F04D 19/002* (2013.01); *F04D 29/601* (2013.01); *G03G 21/206* (2013.01)

(58) Field of Classification Search
None
See application file for complete search history.

(56) References Cited

U.S. PATENT DOCUMENTS

| 6,244,953 | B1 * | 6/2001 | Dugan | ............... H05K 7/20172 361/695 |
| 6,779,975 | B2 | 8/2004 | Takashima et al. | |
| 7,862,297 | B2 * | 1/2011 | Mizuguchi | ............... B41J 29/10 415/214.1 |
| 7,940,525 | B2 * | 5/2011 | Letourneau | ........ H05K 7/20172 361/679.48 |
| 9,976,559 | B2 * | 5/2018 | Shih | ...................... F04D 29/601 |
| 2010/0107397 | A1 * | 5/2010 | Letourneau | ........ H05K 7/20172 29/466 |
| 2016/0222983 | A1 * | 8/2016 | Shih | ...................... F04D 29/601 |

FOREIGN PATENT DOCUMENTS

| JP | 2000022375 A | 1/2000 |
| JP | 2014175350 A | 9/2014 |
| JP | 2016058553 A | 4/2016 |

OTHER PUBLICATIONS

Yasuda—JP 2000022375 A with machine translation (Year: 1998).*

* cited by examiner

*Primary Examiner* — Juan G Flores
(74) *Attorney, Agent, or Firm* — Kim & Stewart LLP

(57) ABSTRACT

According to an embodiment, a fan unit holding mechanism includes an installation bracket with a slot, a projection portion on the bracket, and an elastic member at a bottom of the slot. The installation bracket receives a fan unit within the slot. The projection portion is inserted into an attachment hole of the fan unit when the installation bracket receives the fan unit. The elastic member comes into contact with the fan unit and presses against the fan unit.

20 Claims, 7 Drawing Sheets

US 11,700,708 B2

FAN UNIT HOLDING MECHANISM AND AUTOMATIC DOCUMENT FEEDER INCLUDING FAN UNIT HOLDING MECHANISM

CROSS-REFERENCE TO RELATED APPLICATIONS

This application is based upon and claims the benefit of priority from Japanese Patent Application No. 2020-153500, filed Sep. 14, 2020, the entire contents of which are incorporated herein by reference.

FIELD

Embodiments described herein relate generally to a fan unit holding mechanism and an automatic document feeder including a fan unit holding mechanism.

BACKGROUND

Conventionally, a fan unit is used for cooling various units, devices, components, or the like that are mounted in an electronic apparatus (such as, for example, an automatic document feeder (ADF)) and generate heat when operated. The fan unit is installed in the electronic apparatus by, for example, being attached to an installation bracket or the like via a flange on the fan unit with screws. With such an installation method, since one or more screws are necessary for fixing the fan unit, securely holding the fan unit at a proper position inside the electronic apparatus is troublesome or takes extra time during the installation.

As one method for eliminating the need for fixing the fan unit with screws and also reducing the number of separate device components, a rib with one or more claws can be provided on the installation bracket or the like to securely hold the fan unit via the claws instead of screws. However, with such a holding method, a gap is left between the fan unit and the holding surface, and vibrations and abnormal noises occurring due to the gap are problems.

DETAILED DESCRIPTION

In general, according to one embodiment, a fan unit holding mechanism includes a bracket member with a slot configured to receive a fan unit. A projection portion is on the bracket member. The projection portion extends in a first direction into the slot and is insertable into an attachment hole in the fan unit when the fan unit is inserted into the slot of the bracket member. An elastic member is at a bottom surface of the slot and is configured to contact the fan unit to press against the fan unit from a direction intersecting the first direction when the fan unit is in the slot.

Hereinafter, some example embodiments will be described with reference to the accompanying drawings.

A fan unit holding mechanism 4 of the present embodiment holds a fan unit 1 at an appropriate position inside an ADF 10. In some examples, the fan unit holding mechanism 4 may be referred to as a fan mounting bracket, a bracket, installation bracket, a fan mount, a mount, a holding member, a fan mounting members, or the like. The fan unit 1 includes, for example, fan blades or the like, and is used to bring outside air into the housing of the ADF 10 or the like, and/or for causing air inside the housing to circulate so as to cool or maintain hot components of the electronic apparatus.

Figure 1A:
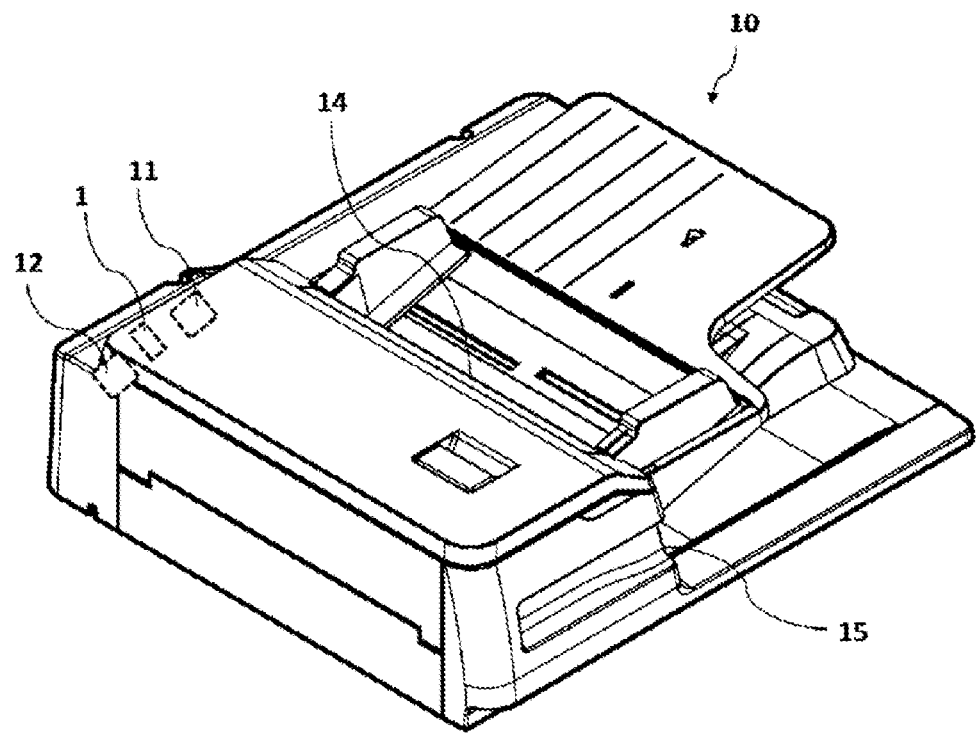
FIG. 1A depicts an ADF in a perspective view according to an embodiment.
Figure 3:
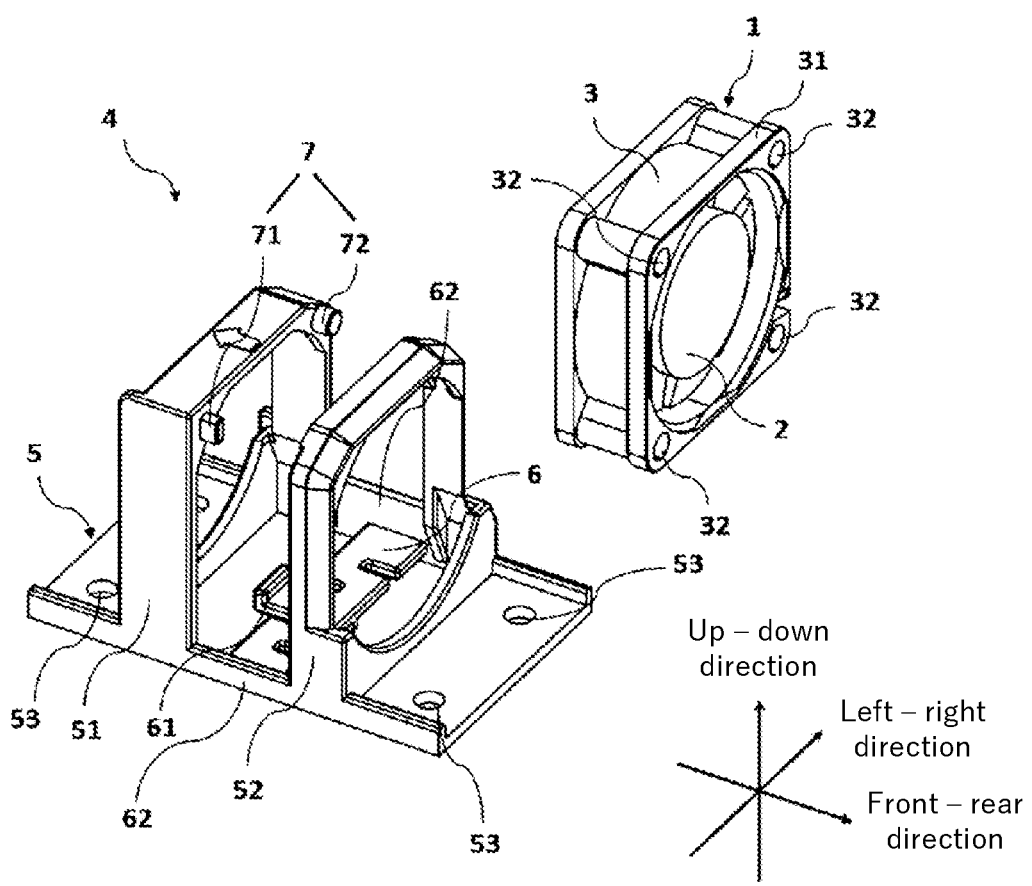
FIG. 3 depicts a fan unit holding mechanism in a perspective view according to an embodiment.
Figure 4:
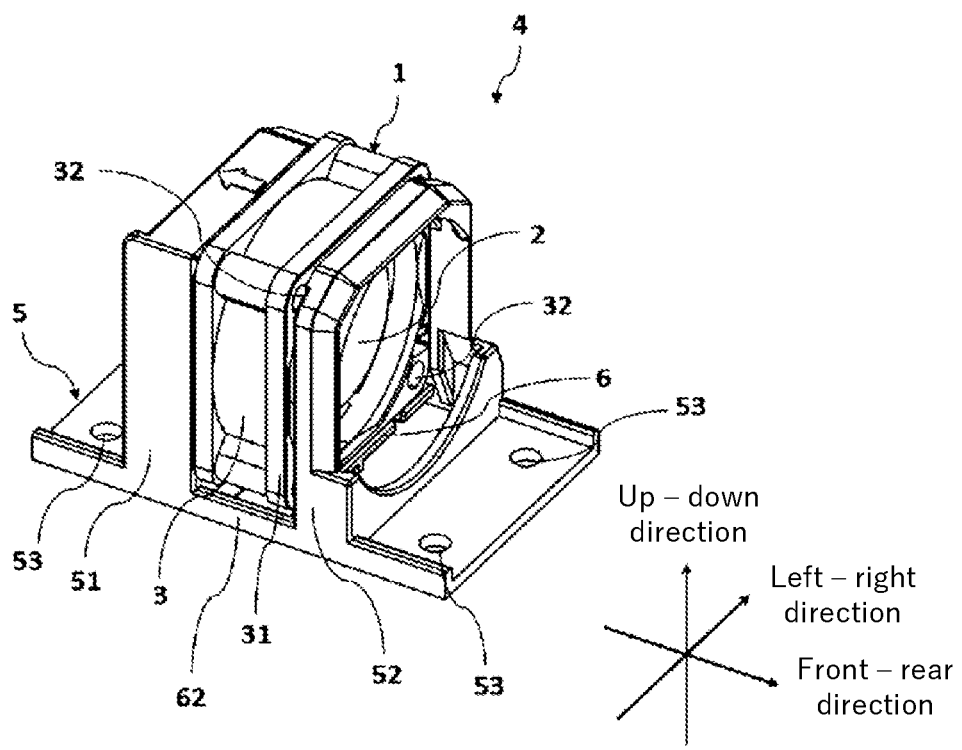
FIG. 4 depicts a fan unit holding mechanism in a perspective view according to an embodiment.

FIG. 1A depicts an ADF 10 as one example of an electronic apparatus according to one embodiment. The ADF 10 in the present embodiment includes a fan unit 1 and a fan unit holding mechanism 4 (FIGS. 3 and 4). The fan unit holding mechanism 4 is formed to hold the fan unit 1 inside the ADF 10. The fan unit 1 generates air flow with a rotating fan blade or the like.

The ADF 10 is, for example, mounted on an upper portion of a multifunction peripheral (MFP), which is one type of image forming apparatus. The ADF 10 of the present embodiment is a dual scan document feeder (DSDF) and conveys a document or a sheet of paper to a scanner also provided in the upper portion of the MFP. One side of the document can be viewed by a scanner through a slit 16 (see FIG. 1B) provided in the bottom portion of the ADF 10. For a DSDF, which is the type of the ADF 10 of the present embodiment, the other side of the document is read with the scanner 17.

Figure 1B:
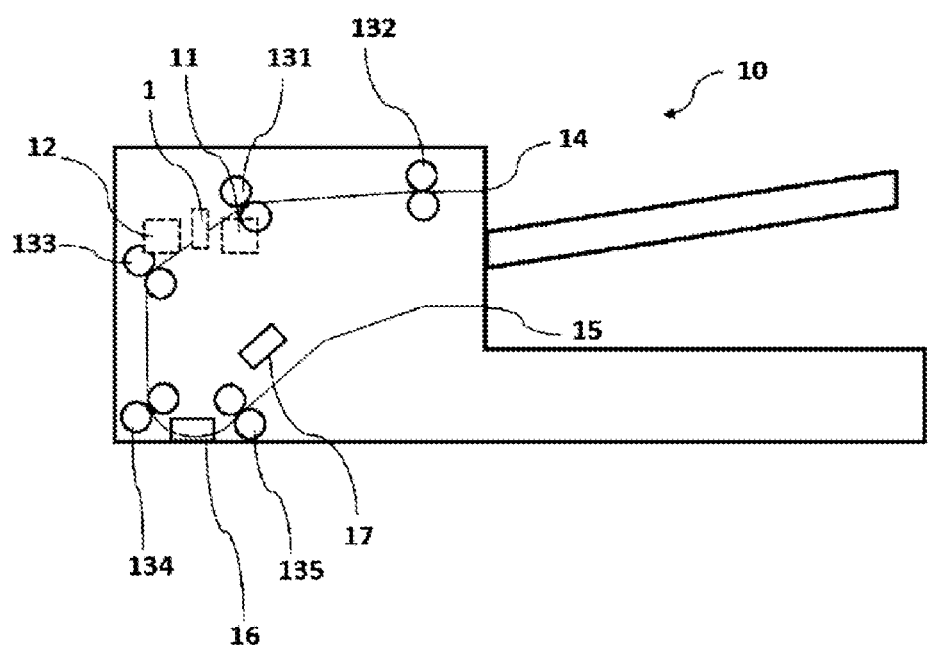
FIG. 1B depicts an ADF in a cross-sectional view according to an embodiment.

FIG. 1B shows a cross section of the ADF 10. The ADF 10 includes conveyance rollers 132, 133, 134, and 135 for conveying a sheet and registration rollers 131. The conveyance rollers 132 to 135 are provided at various positions along the conveyance path so as to convey the sheet from a sheet feed unit 14 (e.g., a sheet entrance port or the like) to a sheet discharge unit 15 (e.g., a sheet exit port or the like). The sheet feed unit 14 and the sheet discharge unit 15 are provided at conveyance start and end positions of the conveyance path, respectively. The registration rollers 131 positioned between the conveyance rollers 132 and 133 along the conveyance path temporarily hold a sheet being conveyed and can resume the conveyance of the sheet at any timing.

Figure 2A:
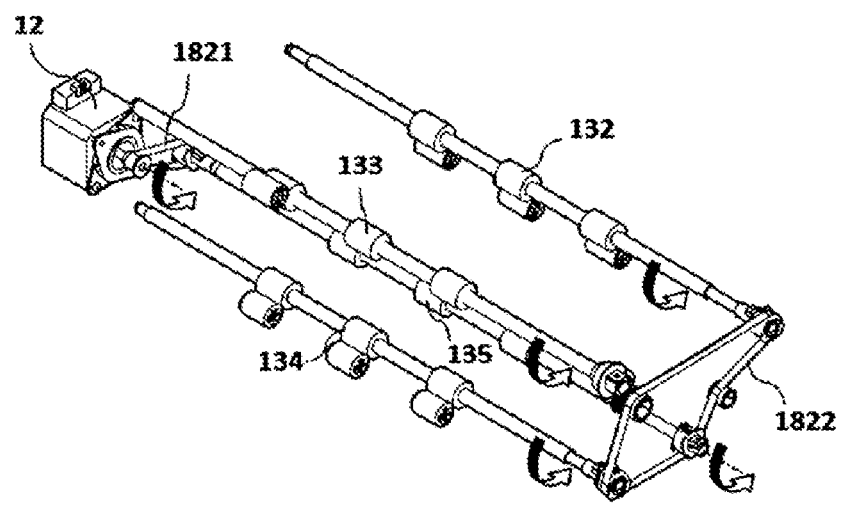
FIG. 2A depicts a motor and a conveyance roller in a perspective view according to an embodiment.

FIG. 2A shows a motor 12 and the conveyance rollers 132 to 135. The motor 12 drives the conveyance roller 135 via a belt 1821. The conveyance roller 135 drives the conveyance rollers 132 to 134 via a belt 1822.

Figure 2B:
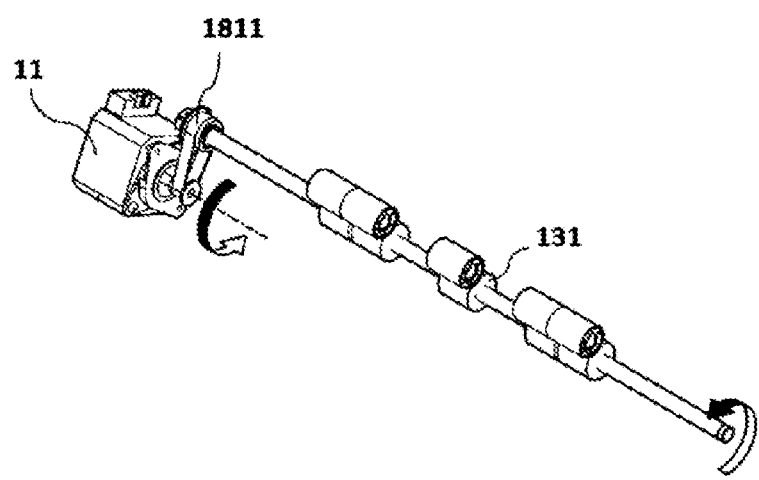
FIG. 2B depicts a motor and a registration roller in a perspective view according to an embodiment.

FIG. 2B shows a motor 11 and the registration rollers 131. The motor 11 drives the registration rollers 131 via a timing belt 1811.

The fan unit 1 operates to cool the motor 11 and the motor 12 in the present embodiment.

The fan unit 1 is installed at a position between the motor 11 and the motor 12 and is held at this position by the fan unit holding mechanism 4. With a conventional fan unit holding mechanism in which the fan unit 1 is fastened to the holding mechanism with screws, a certain amount of working space is required for tightening the screws with a screwdriver or the like. However, with the fan unit holding mechanism 4 of the present embodiment, it is not necessary to provide such a working space for screw fastening. Therefore, the fan unit holding mechanism 4 can be installed at a position (for example, between the motor 11 and the motor 12) where the fan unit holding mechanism could not be installed in the related art due to necessity of providing a space to permit the screw fastening work. In the present embodiment, the fan unit holding mechanism 4 can be placed at a position between the motor 11 and the motor 12 which would not be possible if screw fastening were required. Thus, the fan unit 1 can be installed between the motor 11 and the motor 12 with the fan unit holding mechanism 4, and the cooling air generated by the same fan unit 1 can be more efficiently be sent to both the motor 11 and the motor 12.

FIGS. 3 to 5 depict the fan unit holding mechanism 4 of the present embodiment. The fan unit holding mechanism 4 includes an installation member 5 for receiving the fan unit 1, an elastic member 6 abutting against the fan unit 1 from below, and a first dowel 71 and a second dowel 72 abutting against the fan unit 1 from a front or rea.

With the fan unit holding mechanism 4, screws for fastening the fan unit 1 to the installation member 5 are not necessary, and attachment of the fan unit 1 to the installation member 5 is easier. When the fan unit 1 is being attached to the installation member 5, the elastic member 6 is pressed downward. The installation member 5 suppresses movement of the fan unit 1 with the restoring force (spring back) from the elastic member 6 pressing against the fan unit 1. A part abutting on the fan unit 1 is pressed against the fan unit 1 by the restoring force of the elastic member 6 to leave almost no undesirable gap. This prevents or mitigates abnormal sounds and vibrations due to such a gap or larger size being left.

The fan unit 1 that is installed in the fan unit holding mechanism 4 has one or more rotary blades 2 that rotate around an axis. A casing 3 of the fan unit 1 accommodates the rotary blades 2 therein. The fan unit 1 rotates the rotary blades 2 to generate cooling air whose flow path is substantially along the axial direction. The casing 3 has a flange 31 which is rectangular. The casing 3 has attachment holes 32 which penetrate the casing 3 in a direction parallel with the axial direction of the rotary blades 2 at four corners of the flange 31.

FIG. 3 is a perspective view illustrating the fan unit holding mechanism 4 with the fan unit 1 unmounted, for example, before installation. FIG. 4 is a perspective view illustrating the fan unit holding mechanism 4 after the fan unit 1 has been attached/mounted. The fan unit holding mechanism 4 with the fan unit 1 installed therein may be referred to in some contexts as a fan unit assembly, a fan assembly, or the like.

In FIGS. 3 and 4, the axial direction of the rotary blades 2 of the fan unit 1 is defined as corresponding to the front-rear direction, and directions along two sides orthogonal to the front-rear direction are defined as a left-right direction and an up-down direction. The installation member 5 includes a first support portion 51 and a second support portion 52 that extend upward in the up-down direction. The first support portion 51 is provided behind the second support portion 52 in the front-rear direction. The first support portion 51 has, on its front surface, a first dowel 71 and a second dowel 72 provided at an upper left corner and an upper right corner, respectively. The cooling air generated by the fan unit 1 installed to the installation member 5 flows toward a front of the fan unit holding mechanism 4 in the front-rear direction.

The installation member 5 is a bracket having first support portion 51 and a second support portion 52. The first support portion 51 and the second support portion 52 sandwich the installed fan unit 1 therebetween in the front-rear direction. The distance between the first support portion 51 and the second support portion 52 in the front-rear direction is greater than the dimension of the fan unit 1 in the same direction. The installation member 5 also includes two side ribs 62 that connect the first support portion 51 to the second support portion 52.

Figure 5A:
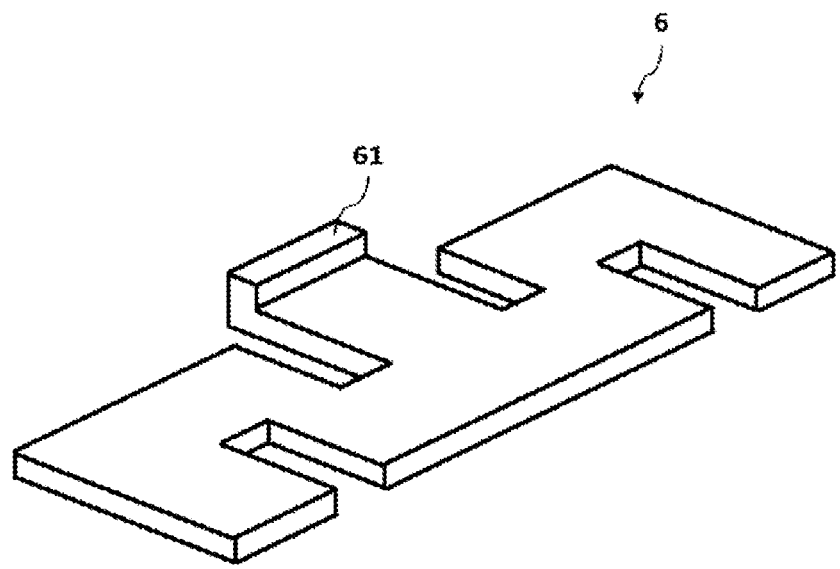
FIGS. 5A and 5B depict an elastic member in a perspective view according to an embodiment.

As shown in FIG. 5A, the elastic member 6 has a claw portion 61 for receiving the fan unit 1. The elastic member 6 connects the two side ribs 62. When viewed from below, the elastic member 6 has a silhouette (outline) that is long in the left-right direction and has a left end and a right end connected to the two side ribs 62. The claw portion 61 protrudes upward from the center portion of the rear end edge of the elastic member 6. The claw portion 61 is elastically deformable such that it can be pushed down by a downward load P applied by the lower surface of the fan unit 1 during installation of the fan unit 1. Upon removal of the fan unit 1, the elastic member 6 or the claw portion 61 pushes against the lower surface of the fan unit 1 with a restoring force R. The restoring force R may be a deflection reaction response force of the elastic member 6. The restoring force R may be a torsional reaction response force of the elastic member 6. The restoring force R may include both components of the deflection reaction force and the torsion reaction force of the elastic member 6.

Figure 5B:
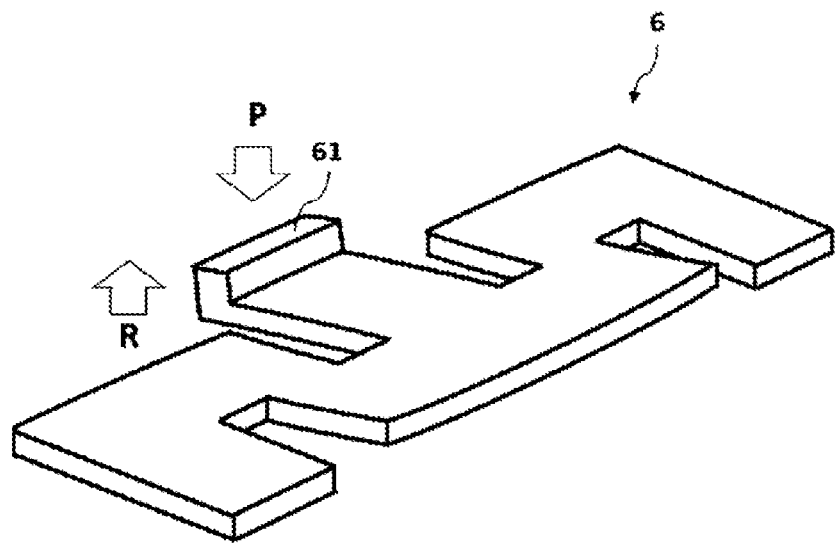

In the example shown in FIG. 5B, the downward load P received at the claw portion 61 twists the elastic member 6. The elastic member 6 may have one or more slits whose longitudinal direction is along the front-rear direction so that the torsional reaction force of the elastic member 6 has an appropriate strength. The slits extending in the front-rear direction appropriately weaken the rigidity of the center portion of the elastic member 6 against the twist or torsion about the axis in the left-right direction.

The elastic member 6 may be or incorporate any elastic body capable of generating a restoring force when deformed by a downward load from the fan unit 1 for pressing upward against the fan unit 1. The shape of the elastic member 6 is not particularly limited so long as the appropriate restoring is provided.

The projection portion 7 has a first dowel 71 and a second dowel 72. The first dowel 71 and the second dowel 72 are provided on the front surface of the first support portion 51. Upon installation of the fan unit 1, the first dowel 71 is inserted into an attachment hole 32 in an upper-left position of the fan unit 1. The second dowel 72 is inserted into an attachment hole 32 in an upper-right position of the fan unit 1.

The length (protruding distance) of the first dowel 71 and the second dowel 72 towards the rear surface of the second support portion 52 is less than the dimension of the fan unit 1 in the front-rear direction. Since the possible movement range of the fan unit 1 in the forward direction is limited by the second support portion 52, the fan unit 1 can be held by the fan unit holding mechanism 4 without the first dowel 71 and the second dowel 72 coming out of the respective attachment holes 32.

In some other examples, the projection portions 7 may be provided at positions corresponding to lower-corner attachment holes 32 among possible attachment holes 32 at the four corners of the casing 3 of the fan unit 1. Depending on dimensions or the like of various relevant components and portions in connection with the installation of the fan unit 1, the provision of the projection portion(s) 7 to correspond to the upper-corner attachment holes 32 generally achieves a more secure attachment and installation of the fan unit 1.

Figure 6A:
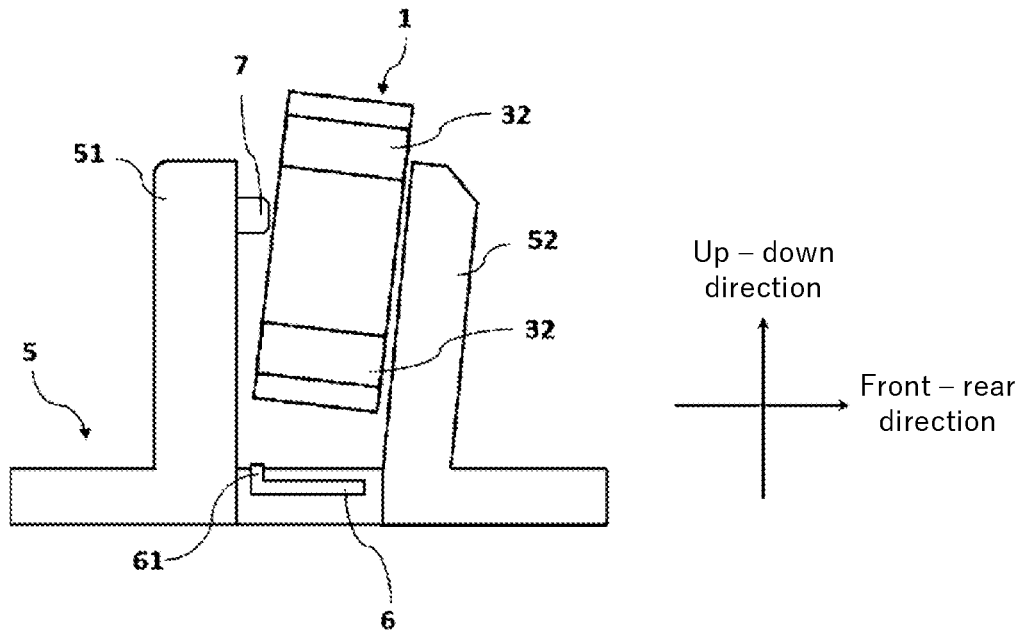
FIGS. 6A and 6B depict a side plane of a fan unit holding mechanism in a cross-sectional view according to an embodiment.
Figure 6B:
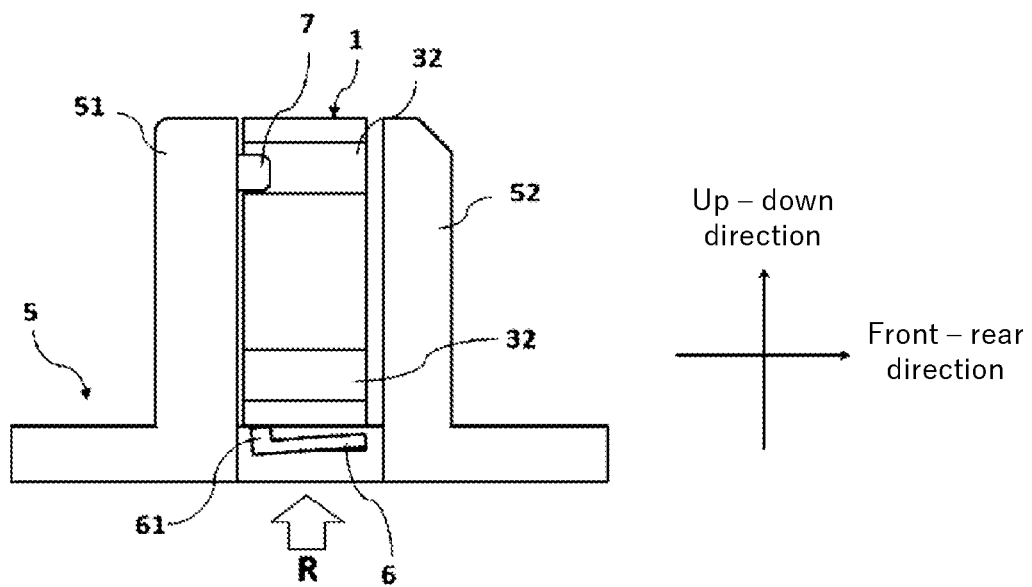

FIGS. 6A and 6B illustrate pre- and post-installation states of the fan unit 1 to the installation member 5 of the fan unit holding mechanism 4.

The fan unit holding mechanism 4 (more particularly the installation member 5) is fastened to the ADF 10 by screws inserted into the screw holes 53 (see FIG. 3).

As shown in FIG. 6A, the fan unit 1 is first slid into a space between the first and second support portions 51 and 52 of the installation member 5 such that the space is enlarged by elastic deformation of an upper part of the second support portion 52 tilting in a direction away from the first support portion 51. As the fan unit 1 further moves downward, the projection portion(s) 7 in the upper part of the first support portion 51 meets the attachment hole(s) 32 of the fan unit 1 and is inserted thereinto while the upper part of the second support portion 52 returns to its original position in the front-rear direction, restoring the original space with the first support portion 51 (FIG. 6B). In this state, the elastic member 6 at the bottom of the space between the first and second support portions 51 and 52 is brought into contact with the lower surface of the fan unit 1 by an upper tip of the claw portion 61 and pushed down by the fan unit 1.

It is preferable that the claw portion 61 always be in contact with the center of the lower surface of the fan unit 1 in the left-right direction. The upper part of the second support portion 52 is elastically deformed in the direction away from the first support portion 51 and provides a restoring force in an opposite direction towards the first support portion 51.

During assembly, the insertion of the projection portion 7 into an attachment hole 32 is assisted by the restoring force from the second support portion 52. An assembler, a user, an operator, or the like only needs to push the fan unit 1 down to in between the first and second support portions 51 and 52 to have the projection portion 7 inserted into the attachment hole 32.

For removal of the fan unit 1 after the installation, by tilting the upper part of the fan unit 1 forward, the second support portion 52 can be elastically deformed again, tilting away from the first support portion 51 such that the space therebetween is enlarged and the projection portion 7 is disengaged from the attachment hole 32. This way, the fan unit 1 can be easily removed by the restoring force R of the elastic member 6.

Figure 7:
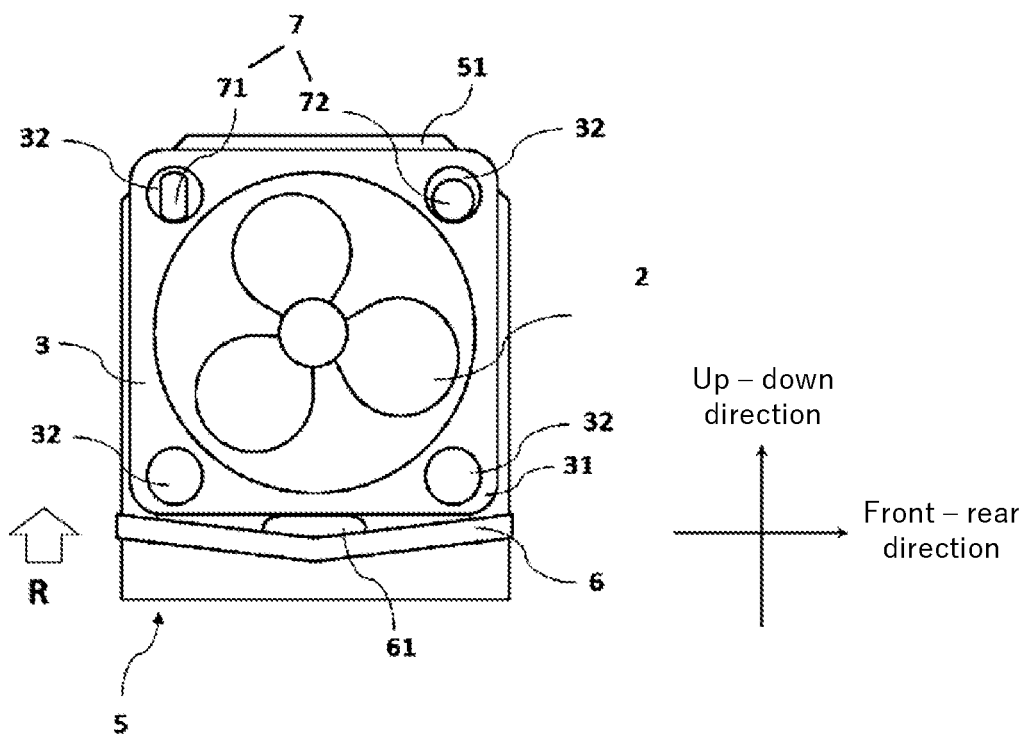
FIG. 7 depicts a front plane of a fan unit holding mechanism in a cross-sectional view according to an embodiment.

FIG. 7 depicts a front plane of the fan unit holding mechanism 4 holding the fan unit 1 in a cross-sectional view.

As shown in FIG. 7, while the fan unit 1 is in place, the fan unit holding mechanism 4 exerts the upward restoring force R of the elastic member 6 and generates a frictional force at positions where the fan unit 1 contacts the elastic member 6 and the projection portion 7. The fan unit holding mechanism 4 presses and holds the fan unit 1 by the elastic member 6 and the projection portion 7 and suppresses movement of the fan unit 1 in the vertical direction, the lateral direction, and the longitudinal direction. The fan unit holding mechanism 4 restricts movement of the fan unit 1 in the front-rear direction to a certain extent by the first support portion 51 and the second support portion 52.

In the present embodiment, after the fan unit 1 is attached to the fan unit holding mechanism 4, the fan unit 1 is constantly pressed against the installation member 5, the elastic member 6, and the projection portion 7. When the fan unit 1 is in contact with the installation member 5, the elastic member 6, and the projection portion 7, vibrations generated by the rotation of the rotary blade 2 will be absorbed at least by the installation member 5 and thus reduced. Abnormal noises due to vibrations that would otherwise be generated by intermittent contact between the fan unit 1 and the surface to which the fan unit 1 has been attached will also be suppressed by the continuous contact between the fan unit 1 and the fan unit holding mechanism 4.

In some examples, the two dowels 71 and 72 of the projection portion 7 may have different shapes from each other. For example, as shown in FIG. 7, the cross section of the first dowel 71 has an oval shape that is elongated in the vertical direction, while the cross section of the second dowel 72 has a circular shape. In one instance, vibrations generated by the fan unit 1 are more easily absorbed by the first dowel 71 having the oval cross section. In another instance, the second dowel 72 having the circular cross section can be more easily inserted into the attachment hole 32 of the fan unit 1.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A fan unit holding mechanism, comprising:
   a bracket member with a slot configured to receive a fan unit;
   a projection portion on the bracket member, the projection portion extending in a first direction into the slot and being insertable into an attachment hole in the fan unit when the fan unit is inserted into the slot of the bracket member; and
   an elastic member at a bottom surface of the slot and configured to contact the fan unit and press against the fan unit from a direction intersecting the first direction when the fan unit is in the slot.

2. The fan unit holding mechanism according to claim 1, wherein the elastic member includes a claw portion configured to contact the fan unit and press the fan unit towards the projection portion.

3. The fan unit holding mechanism according to claim 1, wherein the projection portion comprises a dowel.

4. The fan unit holding mechanism according to claim 1, wherein a protruding length of the projection portion in the first direction is less than a depth of the attachment hole in the first direction.

5. The fan unit holding mechanism according to claim 1, wherein the bracket member comprises:
   a first support portion on one side of the slot in the first direction,
   a second support portion on an opposite side of the slot in the first direction, and
   a base portion to which the first and second support portions are attached.

6. The fan unit holding mechanism according to claim 5, wherein the projection portion is on the first support portion.

7. The fan unit holding mechanism according to claim 6, wherein the second support portion is formed of an elastically deformable material.

8. The fan unit holding mechanism according to claim 5, wherein the first support portion and the second support portion each have a central opening positioned to permit airflow along the first direction when the fan unit is in the slot.

9. The fan unit holding mechanism according to claim 5, wherein the elastic member is on the base portion and generates a restoring force when deflected by the fan unit.

10. The fan unit holding mechanism according to claim 1, wherein the protruding portion has a circular cross-sectional shape.

11. The fan unit holding mechanism according to claim 1, wherein the elastic member comprises a deformable claw portion and one or more slits positioned to permit deformation of the elastic member upon receipt of a downward load from the fan unit.

12. A fan assembly for electronic devices, the fan assembly comprising:
   a fan unit configured to blow air in a first direction, the fan unit having a housing with an attachment hole in a surface intersecting the first direction;
   a bracket member with a slot configured to receive the fan unit;
   a projection portion on the bracket member, the projection portion extending in the first direction into the slot and being insertable into the attachment hole when the fan unit is inserted into the slot of the bracket member; and
   an elastic member at a bottom surface of the slot and configured to contact the fan unit and press against the fan unit from a direction intersecting the first direction when the fan unit is in the slot.

13. The fan assembly according to claim 12, wherein the elastic member includes a claw portion configured to contact the fan unit and press the fan unit towards the projection portion.

14. The fan assembly according to claim 12, wherein the projection portion is a dowel.

15. The fan assembly according to claim 12, wherein a protruding length of the projection portion in the first direction is less than a depth of the attachment hole in the first direction.

16. The fan assembly according to claim 12, wherein the bracket member comprises:
   a first support portion on one side of the slot in the first direction,
   a second support portion on an opposite side of the slot in the first direction, and
   a base portion to which the first and second support portions are attached.

17. An automatic document feeder, comprising:
   a sheet conveyance path with a sheet entrance and a sheet exit;
   a first roller on the sheet conveyance path, the first roller being driven by a first motor;
   a second roller on the sheet conveyance path, the second roller being driven by a second motor; and
   a fan unit assembly at a position between the first and second motors, the fan unit assembly including:
      a fan unit configured to blow air in a first direction toward one of the first or second motors, the fan unit having a housing with an attachment hole in a surface intersecting the first direction;
      a bracket member with a slot configured to receive the fan unit;
      a projection portion on the bracket member, the projection portion extending in the first direction into the slot and being insertable into the attachment hole when the fan unit is inserted into the slot of the bracket member; and
      an elastic member at a bottom surface of the slot and configured to contact the fan unit and press against the fan unit from a direction intersecting the first direction when the fan unit is in the slot.

18. The automatic document feeder according to claim 17, wherein the elastic member includes a claw portion configured to contact the fan unit and press the fan unit towards the projection portion.

19. The automatic document feeder according to claim 17, wherein the bracket member comprises:
   a first support portion on one side of the slot in the first direction,
   a second support portion on an opposite side of the slot in the first direction, and
   a base portion to which the first and second support portions are attached.

20. The automatic document feeder according to claim 19, wherein
   the projection portion is on the first support portion,
   the second support portion is formed of an elastically deformable material, and
   the first support portion and the second support portion each have a central opening positioned to permit airflow along the first direction when the fan unit is in the slot.

* * * * *